United States Patent [19]

Min et al.

[11] Patent Number: 5,319,605
[45] Date of Patent: Jun. 7, 1994

[54] ARRANGEMENT OF WORD LINE DRIVER STAGE FOR SEMICONDUCTOR MEMORY DEVICE

[75] Inventors: Dong-Seon Min; Kyoung-Yeol Min; Dong-Su Jeon, all of Seoul; Yong-Sik Seok, Taegu, all of Rep. of Korea

[73] Assignee: SamSung Electronics Co., Ltd., Suwon, Rep. of Korea

[21] Appl. No.: 726,180

[22] Filed: Jul. 5, 1991

[30] Foreign Application Priority Data

Feb. 5, 1991 [KR] Rep. of Korea ............... 1964/1991

[51] Int. Cl.$^5$ ................ G11C 8/00; G11C 7/00
[52] U.S. Cl. .................. 365/230.06; 365/63; 365/230.04; 307/303.1
[58] Field of Search ........... 365/63, 230.01, 230.04, 365/230.06; 307/303.1

[56] References Cited

U.S. PATENT DOCUMENTS

| | | | |
|---|---|---|---|
| 4,883,980 | 11/1989 | Morimoto et al. | 307/303.1 |
| 4,906,872 | 3/1990 | Tanaka | 307/303.1 |
| 4,958,092 | 9/1990 | Tanaka | 307/303.1 |
| 5,148,401 | 9/1992 | Sekino et al. | 365/230.06 |
| 5,172,335 | 12/1992 | Sasaki et al. | 365/230.06 |

FOREIGN PATENT DOCUMENTS

| | | | |
|---|---|---|---|
| 0064192 | 3/1989 | Japan | 365/230.06 |
| 0245489 | 9/1989 | Japan | 365/230.06 |
| 0156666 | 6/1990 | Japan | 365/230.06 |
| 0235290 | 10/1991 | Japan | 365/230.06 |

*Primary Examiner*—John Zazworsky
*Attorney, Agent, or Firm*—Robert E. Bushnell

[57] ABSTRACT

An arrangement of a word line driver stage for semiconductor memory device is disclosed. The present invention is characterized in that a word line driver stages are into several sub-stages WD11-WD51 within a memory cell array, and each word line extending from a first one or a second one of the sub-stages is alternatively coupled to the sub-stage adjacent thereto. Thus this arrangement is capable of reducing the signal transmission delay and eliminating the adverse factor in the current critical design rule and layout.

10 Claims, 6 Drawing Sheets

ARRANGEMENT OF WORD LINE DRIVER STAGE FOR SEMICONDUCTOR MEMORY DEVICE

FIELD OF THE INVENTION

The present invention relates to the construction of memory arrays in a memory semiconductor device, and particularly to an arrangement of word line driver stages suitable for high density semiconductor memory devices.

BACKGROUND OF THE INVENTION

In a semiconductor memory device having high-density and large-capacitance, as a cell area physically occupied by each memory cell becomes smaller, the width of a word line and a bit line becomes narrower and a layout of a sense amplifier becomes more delicate and precise. In fact, in a DRAM device of a mega scale ($2^{20}$), an extremely strict design rule of a sub-micron unit is required, as is well known in this field. Therefore, to manufacture such DRAM device with this strict design rule, it is essential to achieve the optimal arrangement of the semiconductor memory devices within a limited space.

FIG. 1 illustrates the construction of a known semiconductor memory device. Such known semiconductor memory device 10 is divided into four blocks. Referring to each block, a memory cell array 20 including a sense amplifier is surrounded by a column decoder 30 and a row decoder 60. A word line driver stage 50 is interposed between the memory cell array 20 and the row decoder 60. The word line driver stage 50 selects a relevant word line in response to decoding signals from the row decoder 60 in order to enable access to selected memory cells of the memory cell array 20. The remaining area of the semiconductor memory device 10 excluding the memory cell array 20, the column decoder 30, the row decoder 60 and the word line driver stage 50, represents a peripheral region 11 thereof The connection between the word line driver stage 50 and the memory cell array 20, concerning the conventional memory device of FIG. 1, can be easily understood by referring to a U.S. Pat. No. 4,481,609.

FIG. 2, referred to from the above referenced patent, illustrates a part of FIG. 1 in more detail. Within each memory cell array, a plurality of word lines WL and a plurality of bit lines BL cross one another at right angle (in FIG. 2, a 10×10 arrangement is shown as an example), and memory cells 21 are arranged at the intersections between the word lines and bit lines. Through a column select circuit 31(called Y gate) gated by a decoding signal of the column decoder 30, the bit lines BL are selected. The column select circuit 31 is connected to the sense amplifier 22. All the word lines WL1-WL10 in the memory cell array 20 are connected to the word line driver stage 50, that is, the word line driver stage 50 has a number of word line drivers as many as the number of the word lines, as shown in FIG. 3A.

Referring to FIG. 3A illustrating the above strapping in a more easily understandable form, the word line driver stage 50 has the same number of the word line drivers as that of the word lines in the memory cell array 20. However, the employment of such constitution of the memory cell in a high density memory cell device requires a lengthy word line, and thereby, increasing the line resistance of each word line and delaying the signal transmissions. In an attempt to overcome this disadvantage, i.e., the delay of the signal transmissions, the word line is strapped with a metal line.

FIG. 3B shows that the word line WL and the metal line ML are strapped together. As for a metal strapped-region 52 formed by the conventional method, the greater the number of the metal strapped regions is, the greater the area on the semiconductor memory device physically occupied by these metal strapped regions is. This fact imposes an adverse affect on the design rule and the layout task. Therefore, the conventional strapping method of the word line and the metal line has unsurmountable limit.

Meanwhile, there is another conventional construction providing a more effective arrangement of the word line drivers which drive the word lines suitable for the high density semiconductor device. In this construction, the word line driver stages are disposed at the opposite edges of the memory cell array 20 as shown in FIG. 1, thus each word line driver has two word line pitches. Accordingly the layout problem required by the fine design is overcome. Like the construction disclosed in FIG. 1, however since each word line from each word line driver is extended to the end of the memory cell array, the line resistance and the parasitic capacitance in the word line itself are increased, and the delay of the signal transmissions is provided.

SUMMARY OF THE INVENTION

It is an object of the present invention to provide an arrangement of word line driver stages suitable for high density semiconductor memory device producing practically useful layout and manufacturing process.

It is another object of the present invention to provide an arrangement for eliminating the adverse influence due to the length extension of word lines in a high density semiconductor memory device.

In achieving the above objects, the present invention is characterized in that a single word line driver stage is divided into at least three sub-stages, a word line extending from either one of the sub-stages is not coupled to the sub-stage adjacent thereto, and the other word line next to the one word line is coupled to the other sub-stage.

BRIEF DESCRIPTION OF THE DRAWINGS

The above objects and other advantages of the present invention will become more apparent by describing in detail the preferred embodiment of the present invention with reference to the attached drawings in which.

DESCRIPTION OF THE PREFERRED EMBODIMENTS

Figure 1:
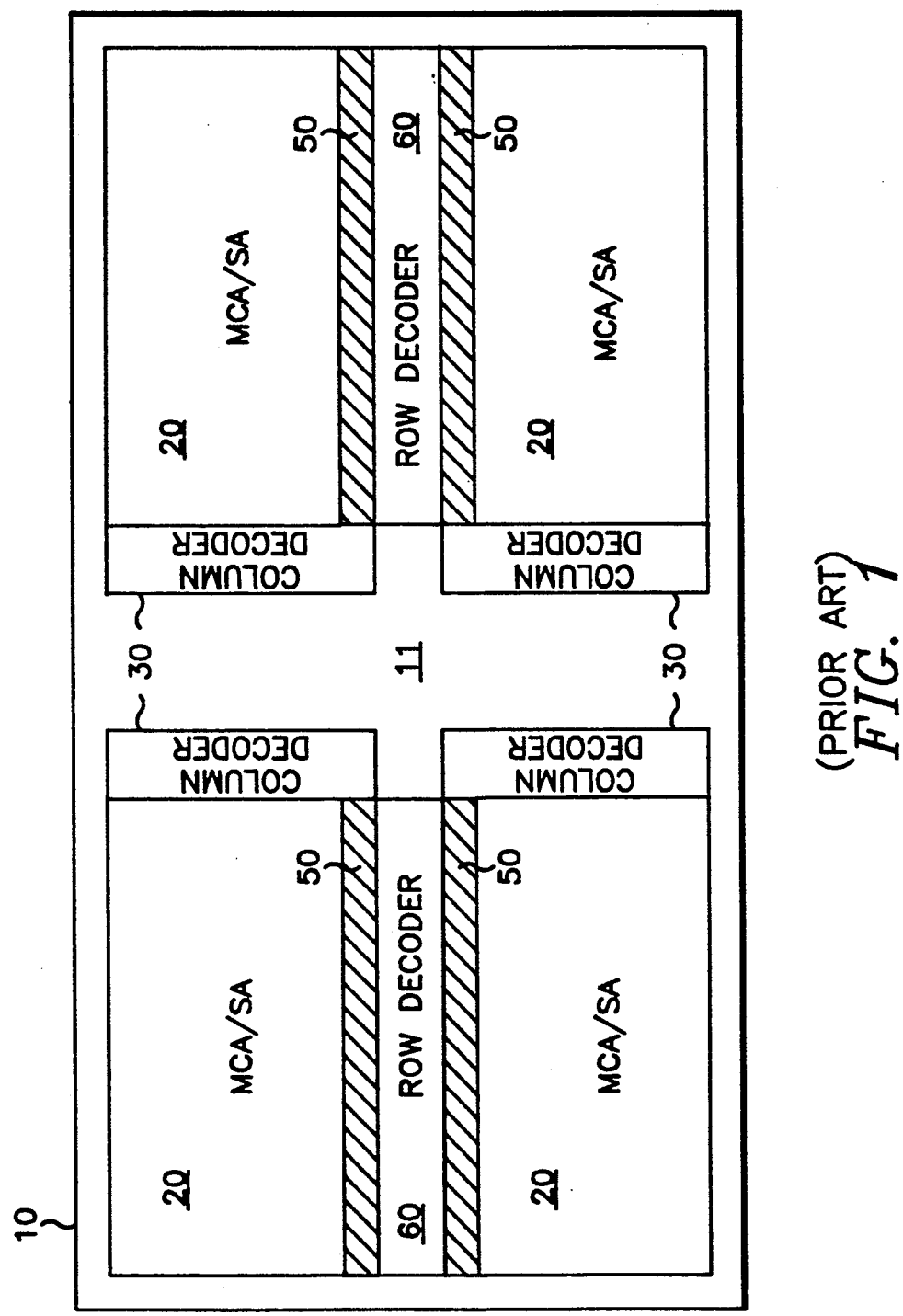
FIG. 1 illustrates the constitution of the conventional semiconductor memory device.
Figure 2:
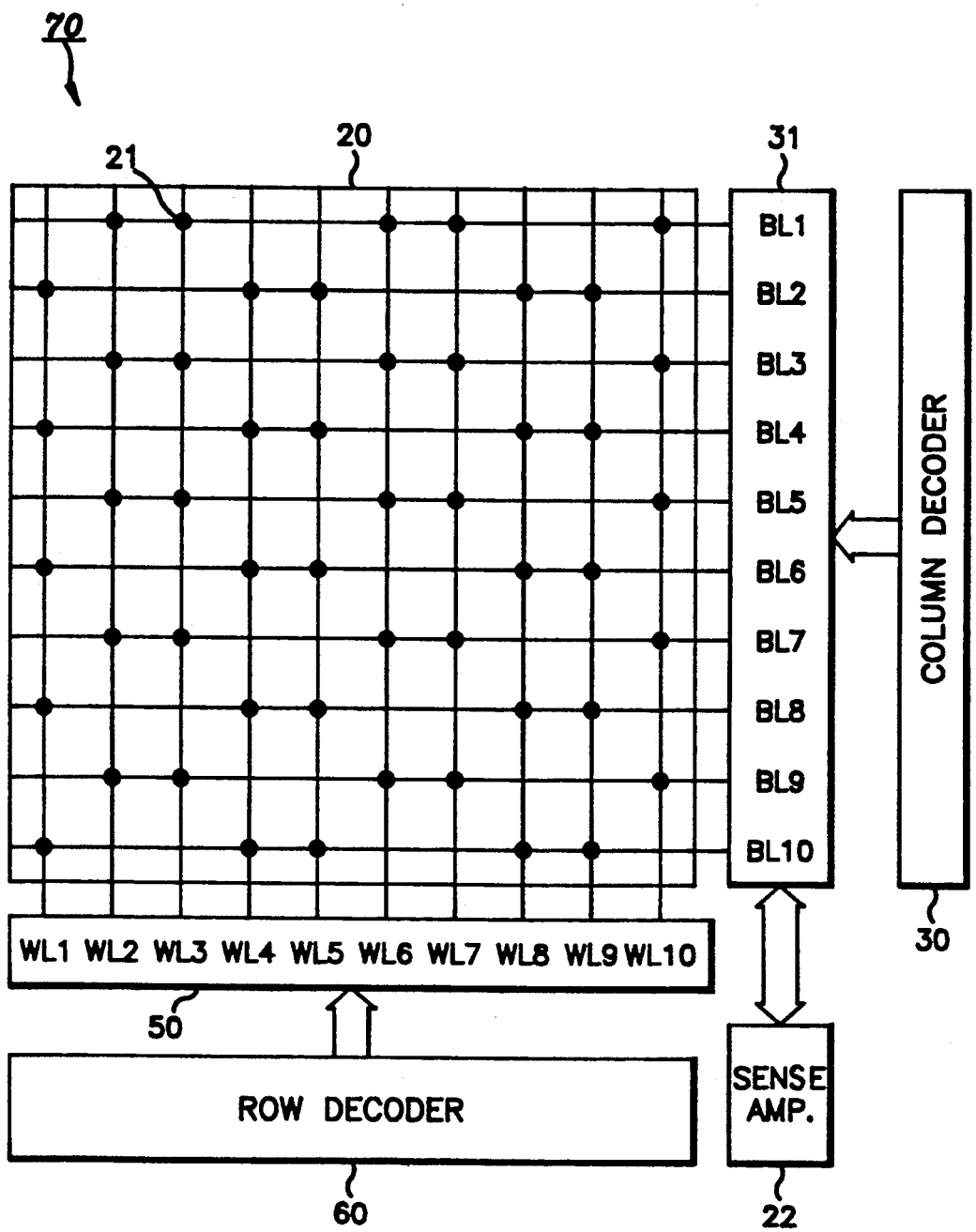
FIG. 2 is a detailed illustration of a part of FIG. 1.
Figure 3A:
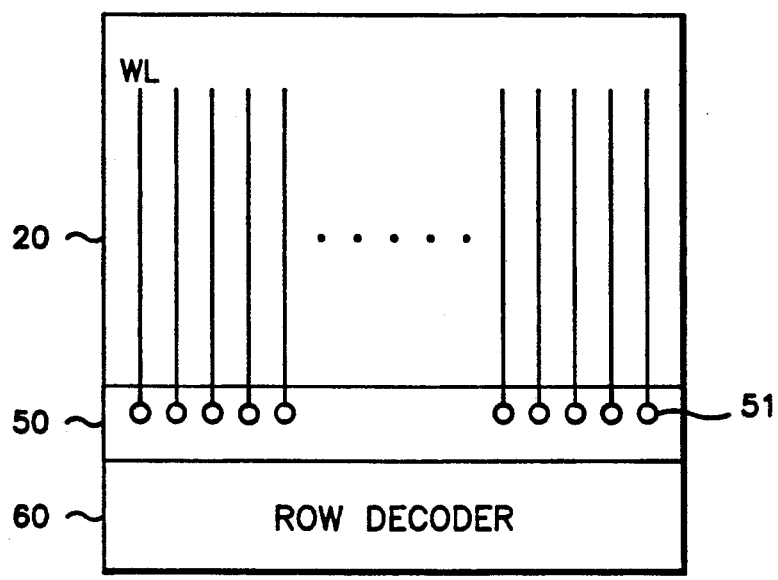
FIGS. 3A and 3B illustrate the conventional method of connecting the word lines to the word line driver stage.
Figure 3B:
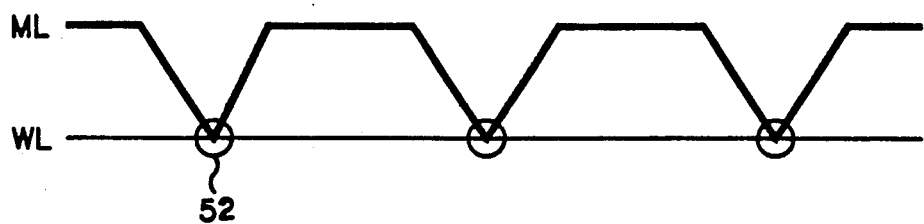
Figure 4:
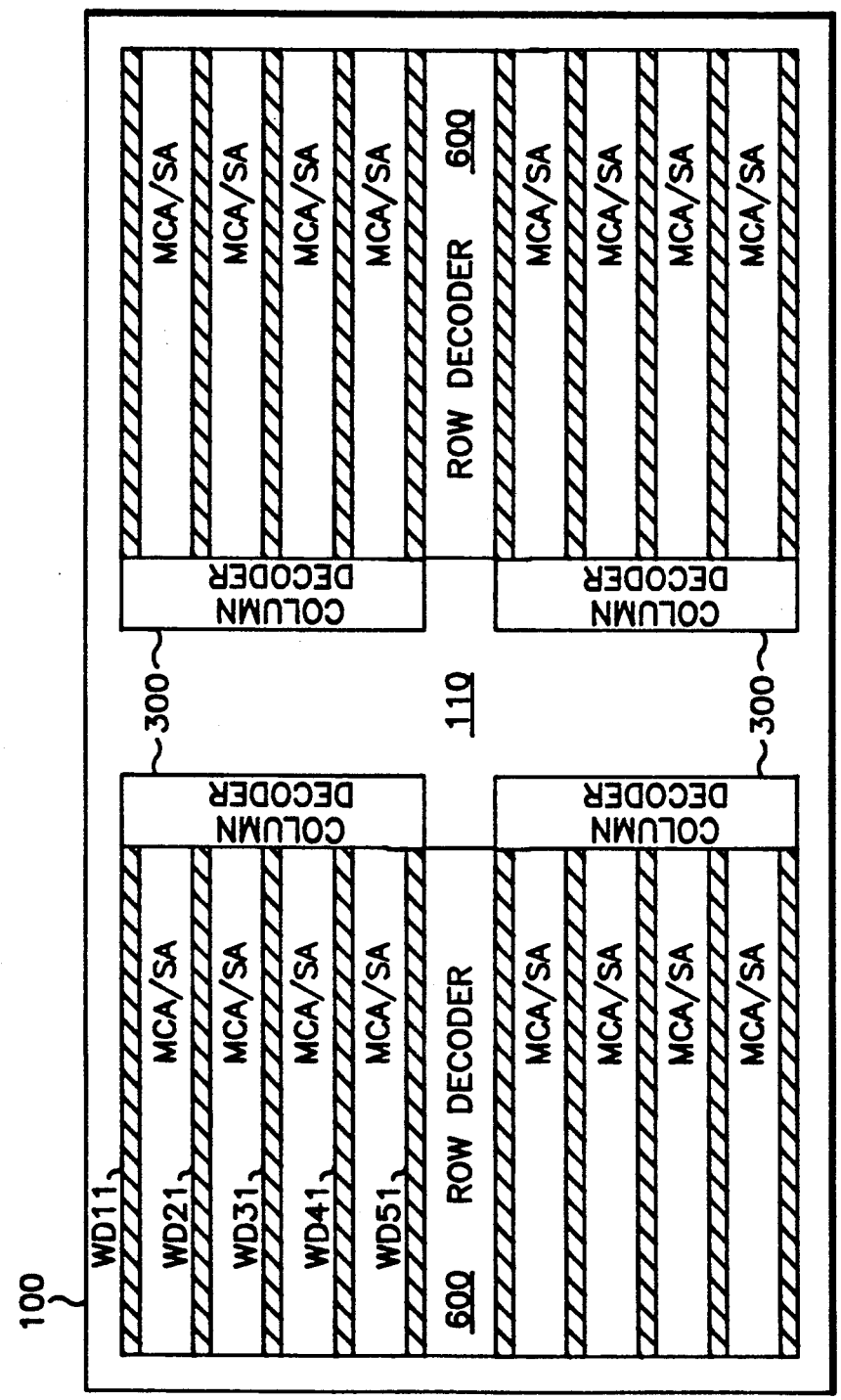
FIG. 4 illustrates the constitution of an embodiment of the semiconductor memory device according to the present invention.

FIG. 4 illustrates an embodiment of the constitution of the semiconductor memory device, according to the present invention. A semiconductor memory device 100 according to the present invention is divided into four memory array blocks. Each memory array block comprises: four memory cell arrays MCA/SA including sense amplifiers; a column decoder 300; five divided word line driver stages WD11, WD21, WD31, WD41, and WD51, disposed on top, bottom and between each memory cell array; and a row decoder 600. The rest region, except for the above memory array blocks, corresponds to a peripheral circuit region 110.

The word line driver stage is divided into five portions, but, depending on the situation of the device, they can be divided into a larger or a smaller number than five. However, the splitting number should be at least three or more if the effect of the present invention is to be realized.

Figure 5:
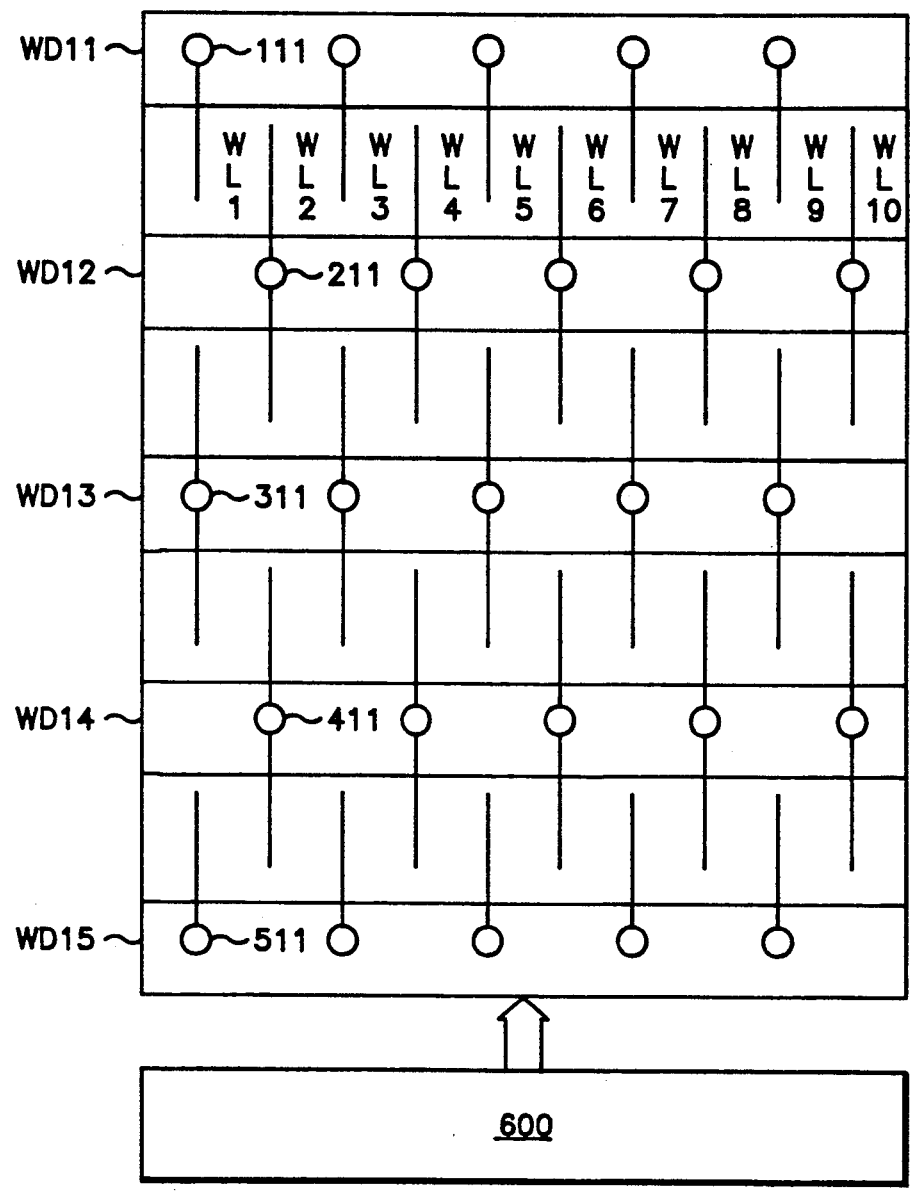
FIG. 5 is a detailed illustration of a part of FIG. 4.

FIG. 5 illustrates the connection state between the word line drivers and the word lines connected thereto, by taking the block of the left top of FIG. 4 as an example. As shown in FIG. 5, a first word line WL1 is connected to the first, third and fifth word line driver stages WD11, WD31, and WD51, while a second word line WL2 is connected to the second and fourth word line driver stages WD21, WD41. That is, the word line driver stages having an interval of a two word line pitch, become possible, and the length of the word line can be shortened in proportion to the number of the division of the word line driver stage.

Accordingly, the area occupied by the word line driver in the lengthwise direction of the row decoder, is decreased by 50%. Particularly, in the case that the dividing number of the word line driver stage is five as shown in FIG. 4 or FIG. 5, the length of the word line can be shortened to one quarter of that disposed by the conventional method.

Figure 6:
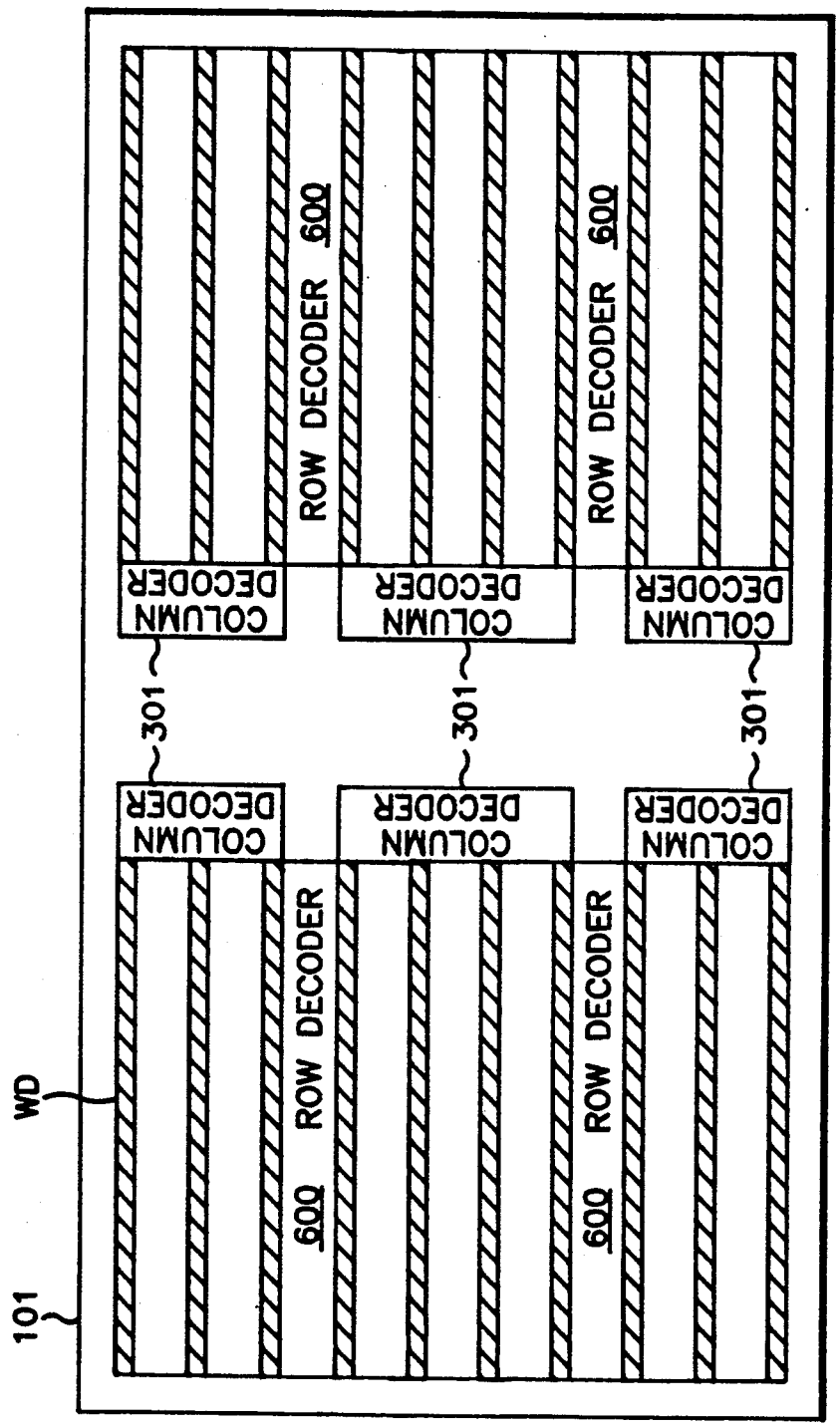
FIG. 6 illustrates the constitution of another embodiment of the semiconductor memory device according to the present invention.

FIG. 6 illustrates another constitution of the word line driver stages in the semiconductor memory device according to the present invention. The semiconductor memory device 101 is divided into six memory array blocks. The block in the upper and lower left corners has the word line driver stage divided into three portions; and the clock in the middle left has the word line driver stage divided into four portions.

Although, in the present invention, only two embodiments are disclosed, it will be easily understood by those skilled in the art that the word line driver stage can be divided into more blocks than those of the embodiments.

Further, according to the present invention, the length of a word line can be shortened. Therefore, the decrease of the load resistance (or line resistance) in the word line itself can be realized by using material having a low sheet resistance such as silicide, without strapping between a word line and a metal line in order to reduce the delay effect, as is known in the arts. Therefore in accordance with the present invention, the area for strapping between a word line and a metal line is not required. Further, word lines extending from the row decoder successively pass through the lower part of each memory array in order to connect with each divided word line driver stage in each memory array.

As described above, since the length of the word lines employed in high density semiconductor memory devices can be shortened, the present invention is not only suitable for the high density semiconductor memory devices, but is also effective in decreasing the signal transmission delay caused by the extension of the length of the word line.

Further, according to the present invention, since the length of the word line can be shortened in proportional to the number of division per each word line driver stage, no additional processes for decreasing the resistance of the word line are necessary.

While the present invention has been particularly shown and described with reference to the embodiments thereof, it will be easily understood by those who skilled in the art that the foregoing and change in form and detail may be made without departing from the spirit and scope of the invention.

What is claimed is:

1. An arrangement of word line driver stages in a semiconductor memory array, comprising:
    a plurality of memory cell arrays having numbers of odd and even memory cell arrays disposed adjacent to each other, each of said odd and even memory cell arrays comprising a plurality of memory cells;
    a plurality of word lines comprising a first set of word lines and a second set of word lines, said first set of said word lines being electrically connected only to memory cells of said odd memory cell arrays and said second set of said word lines being electrically connected only to memory cells of said even memory cell arrays;
    at least three word line driver stages for driving the word lines in the odd and even memory cell arrays, each of said word line stages being positioned on each side of each one of said odd and even memory cell arrays;
    a plurality of bit lines extending through said plurality of memory cell arrays;
    row decoder means for enabling access to memory cells of a selected one of said plurality of memory cell arrays in a row via one of said first and second set of said word lines; and
    column decoder means for enabling access to individual memory cell of said selected one of said plurality of memory cell arrays via said bit lines.

2. The arrangement as claimed in claim 1, further comprised of each of said word line driver stages selects a corresponding different one of said first and second word lines disposed in said memory cell array for enabling access to individual memory cells within said memory cell array.

3. The arrangement as claimed in claim 1, further comprised of each one of said odd and even word lines having a length inversely proportional to the total number of said word line driver stages.

4. An arrangement of word line driver stages in a semiconductor memory, comprising:
    a plurality of word lines comprising a first set of word lines and a second set of word lines;
    a plurality of bit lines;
    row decoder means for decoding selected ones of said first set of said word lines and said second set of word lines;
    column decoder means for selecting said bit lines;
    a plurality of memory cell groups, each of said memory cell groups having a plurality of memory cell arrays and at least three word line driver stages, each of said word line driver stages being positioned on each side of each one of said plurality of memory cell arrays;

the first set of said word lines being connected to only odd ones of said word line driver stages; and the second set of said word lines being connected to only even ones of said word line driver stages.

5. The arrangement as claimed in claim 4, further comprised of each of said word line driver stages selecting one of said first and second set of word lines within a memory cell group corresponding to a word line driver stage.

6. The arrangement as claimed in claim 4, further comprised of said memory cell groups arranged along a direction of the word lines, and a number of said word line driver stages being larger in number than said memory cell groups.

7. A semiconductor memory, comprising:

first, second, third and fourth memory cell arrays respectively disposed adjacent to each other, each of said first, second, third and fourth memory cell arrays having first and second sides of opposite ends and each of said first, second, third and fourth memory cell arrays comprising a plurality of memory cells;

a first word line driver stage positioned adjacent to the first side of said first memory cell array;

a second word line driver stage positioned between the second said of said first memory cell array and the first side of said second memory cell array;

a third word line driver stage positioned between the second side of said second memory cell array and the first side of said third memory cell array;

a fourth word line driver stage positioned between the second side of said third memory cell array and the first side of said fourth memory cell array; and a fifth word line driver stage positioned adjacent to the second side of said fourth memory cell array, said first, third and fifth word line driver stages being disposed to connect with each other by a first group of word lines, and said second and fourth word line driver stages being disposed to connect with each other by a second group of word lines.

8. The semiconductor memory as claimed in claim 7, further comprising:

row decoder means for enabling access, via said word lines, to memory cells in a row of a selected one of said memory cell arrays;

a plurality of bit lines extending through said first, second, third and fourth memory cell arrays; and column decoder means for enabling access, via said word lines, to individual memory cells of said selected one of said memory cell arrays.

9. A semiconductor memory having a plurality of memory array blocks, each of said memory array blocks, comprising:

first, second, third and fourth memory cell arrays respectively disposed adjacent to each other, each of sad first, second, third and fourth memory cell arrays having first and second sides of opposite ends and comprising a plurality of memory cells;

first and second groups of word lines extending through the first, second, third and fourth memory cell arrays;

a first word line driver stage positioned adjacent to the fist side of said first memory cell array;

a second word line driver stage positioned between the second side of said first memory cell array and the first side of said second memory cell array;

a third word line direr stage positioned between the second side of said second memory cell array and the first side of said third memory cell array;

a fourth word line driver sage positioned between the second side of said third memory cell array and the firs side of said fourth memory cell array;

a fifth word line driver stage positioned adjacent to the second side of said fourth memory cell array, said first, third and fifth word line driver stages being disposed to connect with each other via said first group of word lines, and said second and fourth word line driver stages being disposed to connect with each other via said second group of word lines;

row decoder means for enabling access to memory cells in a row of a selected on of said memory cell arrays via said word lines;

a plurality of bit lines extending through said first, second, third an fourth memory cell arrays; and column decoder means for enabling access to individual memory cells of said selected one of said memory cell arrays via said bit lines.

10. A semiconductor memory device, comprising:

first, second, third and fourth memory cell arrays respectively disposed adjacent to each other, each of said first, second third and fourth memory cell arrays having first and second sides of opposite ends and each of said first, second, third and fourth memory cell arrays comprising a plurality of memory cells;

a first block of word line drivers positioned adjacent to the first side of said first memory cell array;

a second block of word line drivers positioned between the second side of said first memory cell array and the first side of said second memory cell array;

a third block of word line drivers positioned between the second side of said second memory cell array and the first side of said third memory cell array;

a fourth block of word line drivers positioned between the second side of said third memory cell array and the first side of said fourth memory cell array;

a fifth block of word line drivers positioned adjacent to the second side of said fourth memory cell array;

a plurality of word lines comprising a first set and a second set of word lines, said first set of word lines being connected to said first, third and fifth blocks of word line drive transistors, and said second set of word lines being connected to said second and fourth blocks of word line transistors;

a plurality of bit lines extending through said first, second, third and fourth memory cell arrays;

row decoder means for enabling access to memory cells in a row of selected ones of said memory cell arrays via one of said first and second set of word lines; and column decoder means for enabling access to individual memory cells of said selected ones of said memory cell arrays via said bit lines.

* * * * *

UNITED STATES PATENT AND TRADEMARK OFFICE
CERTIFICATE OF CORRECTION

PATENT NO. : 5,319,605
DATED : Jun. 7, 1994
INVENTOR(S) : Dong-Seon Min, et al.

Page 1 of 2

It is certified that error appears in the above-indentified patent and that said Letters Patent is hereby corrected as shown below:

IN THE ABSTRACT

Item

[57]    Line 4,    preceding "into", change "stages are" to --stage is divided--, .

IN THE CLAIMS

Column 5

Claim 7    Line 29,    after "second", change "said" to --side--,

Claim 9    Line 61,    preceding "first", change "sad" to --said--,

Column 6

Claim 9    Line 2,    preceding "side", change "fist" to --first--,

Line 6,    preceding "stage", change "direr" to --driver--,

UNITED STATES PATENT AND TRADEMARK OFFICE
CERTIFICATE OF CORRECTION

PATENT NO. : 5,319,605
DATED : Jun. 7, 1994
INVENTOR(S) : Dong-Seon Min, et al.

It is certified that error appears in the above-indentified patent and that said Letters Patent is hereby corrected as shown below:

IN THE CLAIMS

Column 6

<u>Claim 9</u>  Line 9,   after "driver", change "sage" to --stage--,

Line 11,  preceding "side", change "firs" to --first--,

Line 21,  after "selected", change "on" to --one--.

Signed and Sealed this

Eighth Day of October, 1996

Attest:

BRUCE LEHMAN

Attesting Officer    Commissioner of Patents and Trademarks